(12) United States Patent
Xu et al.

(10) Patent No.: US 11,909,248 B2
(45) Date of Patent: Feb. 20, 2024

(54) ACCESSORY WITH A MAGNETIC RELAY STRUCTURE FOR WIRELESS POWER TRANSFER

(71) Applicant: Apple Inc., Cupertino, CA (US)

(72) Inventors: Zelin Xu, San Jose, CA (US); Nan Liu, Sunnyvale, CA (US); Zaki Moussaoui, San Carlos, CA (US); Gianpaolo Lisi, Santa Clara, CA (US); Kunal Bhargava, Auckland (NZ); Madhusudanan Keezhveedi Sampath, San Jose, CA (US); Matthew J. Chabalko, Santa Cruz, CA (US); Robert Scritzky, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 289 days.

(21) Appl. No.: 17/179,647

(22) Filed: Feb. 19, 2021

(65) Prior Publication Data

US 2021/0384754 A1 Dec. 9, 2021

Related U.S. Application Data

(60) Provisional application No. 63/034,544, filed on Jun. 4, 2020.

(51) Int. Cl.
*H02J 7/02* (2016.01)
*H02J 7/00* (2006.01)
(Continued)

(52) U.S. Cl.
CPC ............ *H02J 7/02* (2013.01); *G06F 3/03545* (2013.01); *H01F 7/02* (2013.01); *H02J 7/0042* (2013.01);
(Continued)

(58) Field of Classification Search
CPC ...... H05K 5/03; H05K 9/0007; H05K 9/0075; H05K 9/0071; H05K 7/00; H01F 7/00; H01F 7/02; H02J 50/10; H02J 50/005
See application file for complete search history.

(56) References Cited

U.S. PATENT DOCUMENTS

| 6,677,756 B2 | 1/2004 | Fanini et al. |
| 9,509,177 B2 | 11/2016 | Nahidipour |

(Continued)

FOREIGN PATENT DOCUMENTS

| CN | 204259314 U | 4/2015 |
| CN | 110098662 A | 8/2019 |

(Continued)

*Primary Examiner* — Richard Isla
*Assistant Examiner* — Sadia Kousar
(74) *Attorney, Agent, or Firm* — Treyz Law Group, P.C.; Joseph F. Guihan

(57) ABSTRACT

A device in a wireless power system may be operable with a removable accessory such as a case. The device may transmit or receive wireless power through the case while the electronic device is coupled to the case. The case may have a folio shape with a front cover portion that covers the display of the electronic device. The case may have an embedded ferrimagnetic core that relays magnetic flux during wireless power transfer operations. Magnetic alignment structures in the case may position the ferrimagnetic core in the case in a high magnetic flux density region between the power transmitting device and the power receiving device. The ferrimagnetic core relays the magnetic flux between a transmitting coil in the power transmitting device and a receiving coil in the power receiving device. The ferrimagnetic core may be formed in a front portion, a sidewall, or a rear wall of a case.

20 Claims, 12 Drawing Sheets

(51) Int. Cl.
*H02J 50/10* (2016.01)
*H05K 5/03* (2006.01)
*G06F 3/0354* (2013.01)
*H01F 7/02* (2006.01)
*H05K 9/00* (2006.01)
*H05K 5/00* (2006.01)

(52) U.S. Cl.
CPC ............ *H02J 50/10* (2016.02); *H05K 5/0017* (2013.01); *H05K 5/03* (2013.01); *H05K 9/0007* (2013.01)

(56) References Cited

U.S. PATENT DOCUMENTS

| | | |
|---|---|---|
| 9,672,976 B2 | 6/2017 | Levo et al. |
| 10,056,786 B2 | 8/2018 | Walley et al. |
| 10,147,991 B1 | 12/2018 | Wu et al. |
| 10,229,782 B2 | 3/2019 | Muratov |
| 10,277,043 B2 | 4/2019 | Graham et al. |
| 10,522,914 B2 | 12/2019 | Hong et al. |
| 10,725,515 B2 * | 7/2020 | Marshall ............... G06F 1/1656 |
| 11,237,650 B2 * | 2/2022 | Kim ...................... H02J 7/0047 |
| 2014/0125143 A1 | 5/2014 | Yamada et al. |
| 2016/0056664 A1 * | 2/2016 | Partovi ................... H02J 50/80 307/104 |
| 2016/0094078 A1 * | 3/2016 | Graham ................. H02J 50/50 320/108 |
| 2017/0170678 A1 | 6/2017 | Uhm |
| 2017/0300085 A1 * | 10/2017 | Hintermann ........... A45C 11/00 |
| 2018/0314349 A1 | 11/2018 | Jiang et al. |
| 2019/0123588 A1 | 4/2019 | Kim et al. |
| 2019/0207425 A1 | 7/2019 | Hansen |
| 2019/0260235 A1 | 8/2019 | Hemphill et al. |
| 2019/0260410 A1 | 8/2019 | Ashworth et al. |
| 2019/0311848 A1 | 10/2019 | Chen et al. |
| 2019/0356165 A1 | 11/2019 | Jacobson et al. |

FOREIGN PATENT DOCUMENTS

| | | |
|---|---|---|
| EP | 3373414 A1 | 9/2018 |
| JP | 3225411 B2 | 8/2001 |
| JP | 2013135523 A | 7/2013 |
| JP | 2014220994 A | 11/2014 |
| JP | 2018180817 A | 11/2018 |
| JP | 2018191515 A | 11/2018 |
| JP | 2019067381 A | 4/2019 |
| JP | 2019122149 A | 7/2019 |
| WO | 2018082769 A1 | 5/2018 |

* cited by examiner

ACCESSORY WITH A MAGNETIC RELAY STRUCTURE FOR WIRELESS POWER TRANSFER

This application claims priority to U.S. provisional patent application No. 63/034,544 filed Jun. 4, 2020, which is hereby incorporated by reference herein in its entirety.

FIELD

This relates generally to power systems, and, more particularly, to wireless power systems for charging electronic devices.

BACKGROUND

In a wireless charging system, a wireless power transmitting device such as a charging mat or charging puck wirelessly transmits power to a wireless power receiving device such as a portable electronic device. The portable electronic device has a coil and rectifier circuitry. The coil of the portable electronic device receives alternating-current wireless power signals from the wireless power transmitting device. The rectifier circuitry converts the received signals into direct current power.

SUMMARY

A wireless power system has a wireless power transmitting device and a wireless power receiving device. The wireless power transmitting device may include a coil and wireless power transmitting circuitry coupled to the coil. The wireless power transmitting circuitry may be configured to transmit wireless power signals with the coil. The wireless power receiving device may include a coil that is configured to receive wireless power signals from the wireless power transmitting device and rectifier circuitry that is configured to convert the wireless power signals to direct current power.

A device in a wireless power system may be operable with a removable accessory such as a case. The device may transmit or receive wireless power through the case while the electronic device is coupled to the case. The case may have a folio shape with a front cover portion that covers the display of the electronic device.

The removable accessory may have an embedded ferrimagnetic core that relays magnetic flux during wireless power transfer operations between electronic devices adjacent to the removable accessory. Magnetic alignment structures in the case may position the ferrimagnetic core in the case in a high magnetic flux density region between the power transmitting device and the power receiving device. The ferrimagnetic core relays the magnetic flux between a transmitting coil in the power transmitting device and a receiving coil in the power receiving device.

The ferrimagnetic core may be formed in a front portion of a case that is configured to cover a display of an electronic device. The ferrimagnetic core may also be formed in a sidewall or a rear wall of a case. The case may include copper shielding structures around the ferrimagnetic core.

DETAILED DESCRIPTION

A wireless power system has a wireless power transmitting device that transmits power wirelessly to a wireless power receiving device. The wireless power transmitting device may be a device such as a wireless charging mat, wireless charging puck, wireless charging stand, wireless charging table, or other wireless power transmitting equipment. The wireless power transmitting device may be a stand-alone device or built into other electronic devices such as a laptop or tablet computer, cellular telephone or other electronic device. The wireless power transmitting device has one or more coils that are used in transmitting wireless power to one or more wireless power receiving coils in the wireless power receiving device. The wireless power receiving device is a device such as a cellular telephone, watch, media player, tablet computer, pair of earbuds, remote control, laptop computer, electronic pencil or stylus, other portable electronic device, or other wireless power receiving equipment.

During operation, the wireless power transmitting device supplies alternating-current signals to one or more wireless power transmitting coils. This causes the coils to transmit alternating-current electromagnetic signals (sometimes referred to as wireless power signals) to one or more corresponding coils in the wireless power receiving device. Rectifier circuitry in the wireless power receiving device converts received wireless power signals into direct-current (DC) power for powering the wireless power receiving device.

In some instances, an electronic device may be coupled to a removable case. When held by the removable case, a portion of the removable case may sometimes be interposed between the electronic device and an adjacent electronic device. In one example, the electronic device held by the case may serve as a power receiving device and the adjacent electronic device may serve as a power transmitting device. In another example, the electronic device held by the case may serve as a power transmitting device and the adjacent electronic device may serve as a power receiving device. The presence of the removable case may lead to an increased distance between coils in the wireless power receiving device and the wireless power transmitting device. To improve charging efficiency, the removable case may include one or more magnetic cores (e.g., ferrite pieces) to direct magnetic flux from the transmitting device to the receiving device.

Figure 1:
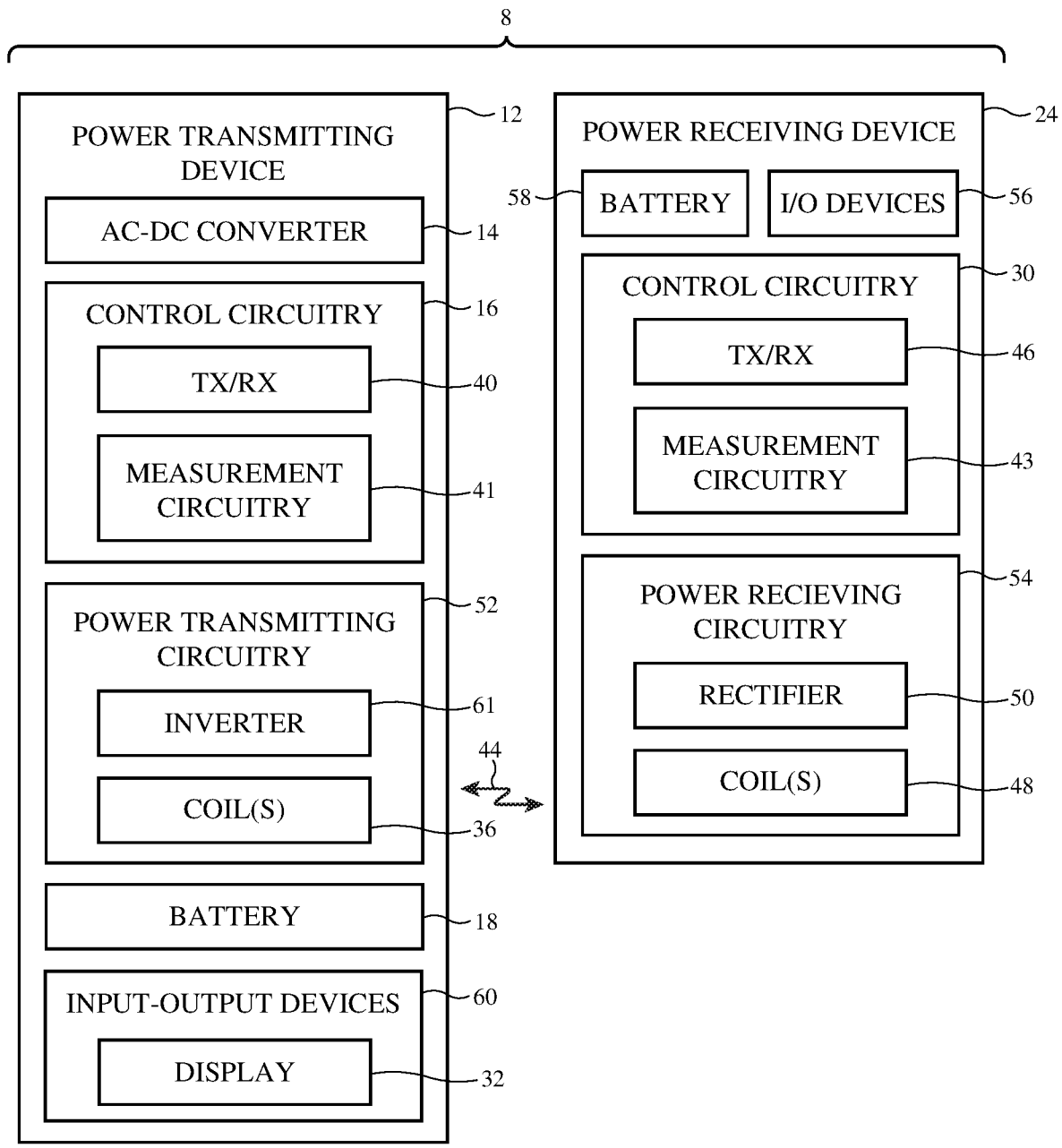
FIG. 1 is a schematic diagram of an illustrative wireless charging system that includes a wireless power transmitting device and a wireless power receiving device in accordance with an embodiment.

An illustrative wireless power system (wireless charging system) is shown in FIG. 1. As shown in FIG. 1, wireless power system 8 includes a wireless power transmitting device such as wireless power transmitting device 12 and includes a wireless power receiving device such as wireless power receiving device 24. Wireless power transmitting device 12 includes control circuitry 16. Wireless power receiving device 24 includes control circuitry 30. Control circuitry in system 8 such as control circuitry 16 and control circuitry 30 is used in controlling the operation of system 8. This control circuitry may include processing circuitry associated with microprocessors, power management units, baseband processors, digital signal processors, microcontrollers, and/or application-specific integrated circuits with processing circuits. The processing circuitry implements desired control and communications features in devices 12 and 24. For example, the processing circuitry may be used in selecting coils, determining power transmission levels, processing sensor data and other data, processing user input, handling negotiations between devices 12 and 24, sending and receiving in-band and out-of-band data, making measurements, and otherwise controlling the operation of system 8.

Control circuitry in system 8 may be configured to perform operations in system 8 using hardware (e.g., dedicated hardware or circuitry), firmware and/or software. Software code for performing operations in system 8 is stored on non-transitory computer readable storage media (e.g., tangible computer readable storage media) in control circuitry 8. The software code may sometimes be referred to as software, data, program instructions, instructions, or code. The non-transitory computer readable storage media may include non-volatile memory such as non-volatile random-access memory (NVRAM), one or more hard drives (e.g., magnetic drives or solid state drives), one or more removable flash drives or other removable media, or the like. Software stored on the non-transitory computer readable storage media may be executed on the processing circuitry of control circuitry 16 and/or 30. The processing circuitry may include application-specific integrated circuits with processing circuitry, one or more microprocessors, a central processing unit (CPU) or other processing circuitry.

Power transmitting device 12 may be a stand-alone power adapter (e.g., a wireless power transmitting device that includes power adapter circuitry), may be a wireless charging puck or other device that is coupled to a power adapter or other equipment by a cable, may be equipment that has been incorporated into furniture, a vehicle, or other system, may be a removable battery case, or may be other wireless power transfer equipment. In some cases, power transmitting device 12 may be a portable electronic device such as a cellular telephone, watch, media player, tablet computer, pair of earbuds, remote control, laptop computer, electronic pencil or stylus, or other portable electronic device. Power transmitting device 12 may also be capable of receiving wireless power (and may have similar power receiving components as power receiving device 24).

Power receiving device 24 may be a portable electronic device such as a cellular telephone, watch, media player, tablet computer, pair of earbuds, remote control, laptop computer, electronic pencil or stylus, other portable electronic device, or other wireless power receiving equipment.

Power transmitting device 12 may be coupled to a wall outlet (e.g., an alternating current power source), may have a battery such as battery 18 for supplying power, and/or may have another source of power. Power transmitting device 12 may have an alternating-current (AC) to direct-current (DC) power converter such as AC-DC power converter 14 for converting AC power from a wall outlet or other power source into DC power. DC power may be used to power control circuitry 16 and other components within device 12. In some cases, a single electronic device may be configured to serve as both a power receiving device and a power transmitting device (e.g., the device has both power transmitting circuitry and power receiving circuitry).

The DC power may be used to power control circuitry 16. During operation, a controller in control circuitry 16 uses power transmitting circuitry 52 to transmit wireless power to power receiving circuitry 54 of device 24. Power transmitting circuitry 52 may have switching circuitry (e.g., inverter circuitry 61 formed from switches such as transistors) that is turned on and off based on control signals provided by control circuitry 16 to create AC current signals through one or more wireless power transmitting coils such as wireless power transmitting coils 36. Coils 36 may be arranged in a planar coil array (e.g., in configurations in which device 12 is a wireless charging mat) or may be arranged to form a cluster of coils (e.g., in configurations in which device 12 is a wireless charging puck). In some arrangements, device 12 may have only a single coil. In other arrangements, device 12 may have multiple coils (e.g., two coils, more than two coils, four or more coils, six or more coils, 2-6 coils, fewer than 10 coils, etc.).

As the AC currents pass through one or more coils 36, alternating-current electromagnetic (e.g., magnetic) fields (wireless power signals 44) are produced that are received by one or more corresponding receiver coils such as coil(s) 48 in power receiving device 24. Device 24 may have a single coil 48, at least two coils 48, at least three coils 48, at least four coils 48, or other suitable number of coils 48.

When the alternating-current electromagnetic fields (sometimes referred to as magnetic flux) are received by coils 48 (e.g., when magnetic flux passes through coils 48), corresponding alternating-current currents are induced in coils 48. Rectifier circuitry such as rectifier circuitry 50, which contains rectifying components such as synchronous rectification metal-oxide-semiconductor transistors arranged in a bridge network, converts received AC signals (received alternating-current signals associated with electromagnetic signals 44) from one or more coils 48 into DC voltage signals for powering device 24.

The DC voltage produced by rectifier circuitry 50 (sometimes referred to as rectifier output voltage Vrect) can be used in charging a battery such as battery 58 and can be used in powering other components in device 24. For example, device 24 may include input-output devices 56. Input-output devices 56 may include input devices for gathering user input and/or making environmental measurements and may include output devices for providing a user with output. As an example, input-output devices 56 may include a display for creating visual output, a speaker for presenting output as audio signals, light-emitting diode status indicator lights and other light-emitting components for emitting light that provides a user with status information and/or other information, haptic devices for generating vibrations and other haptic output, and/or other output devices. Input-output devices 56 may also include sensors for gathering input from a user and/or for making measurements of the surroundings of system 8. Illustrative sensors that may be included in input-output devices 56 include three-dimensional sensors (e.g., three-dimensional image sensors such as structured light sensors that emit beams of light and that use two-dimensional digital image sensors to gather image data for three-dimensional images from light spots that are produced when a target is illuminated by the beams of light, binocular three-dimensional image sensors that gather three-dimensional images using two or more cameras in a binocular imaging arrangement, three-dimensional lidar (light detection and ranging) sensors, three-dimensional radio-frequency sensors, or other sensors that gather three-dimensional image data), cameras (e.g., infrared and/or visible cameras with respective infrared and/or visible digital image sensors and/or ultraviolet light cameras), gaze tracking sensors (e.g., a gaze tracking system based on an image sensor and, if desired, a light source that emits one or more beams of light that are tracked using the image sensor after reflecting from a user's eyes), touch sensors, buttons, capacitive proximity sensors, light-based (optical) proximity sensors such as infrared proximity sensors, other proximity sensors, force sensors, sensors such as contact sensors based on switches, gas sensors, pressure sensors, moisture sensors, magnetic sensors, audio sensors (microphones), ambient light sensors, optical sensors for making spectral measurements and other measurements on target objects (e.g., by emitting light and measuring reflected light), microphones for gathering voice commands and other audio input, distance sensors, motion, position, and/or orientation sensors that are configured to gather information on motion, position, and/or orientation (e.g., accelerometers, gyroscopes, compasses, and/or inertial measurement units that include all of these sensors or a subset of one or two of these sensors), sensors such as buttons that detect button press input, joysticks with sensors that detect joystick movement, keyboards, and/or other sensors. Any of these input-output components (which form a load for device 24) may be powered by the DC voltages produced by rectifier circuitry 50 (and/or DC voltages produced by battery 58).

Device 12 may optionally have one or more input-output devices 60 (e.g., input devices and/or output devices of the type described in connection with input-output devices 56). For example, device 12 may be a tablet computer that includes a display 32 and one or more sensors.

Device 12 and/or device 24 may communicate wirelessly using in-band or out-of-band communications. Device 12 may, for example, have wireless transceiver circuitry 40 that wirelessly transmits out-of-band signals to device 24 using an antenna. Wireless transceiver circuitry 40 may be used to wirelessly receive out-of-band signals from device 24 using the antenna. Device 24 may have wireless transceiver circuitry 46 that transmits out-of-band signals to device 12. Receiver circuitry in wireless transceiver 46 may use an antenna to receive out-of-band signals from device 12. In-band transmissions between devices 12 and 24 may be performed using coils 36 and 48.

It is desirable for power transmitting device 12 and power receiving device 24 to be able to communicate information such as received power, states of charge, and so forth, to control wireless power transfer. However, this process need not involve the transmission of device identification information. Out of an abundance of caution, it is noted that to the extent that any implementation of this charging technology involves the use of device identification information (or more generally, personally identifiable information), implementers should follow privacy policies and practices that are generally recognized as meeting or exceeding industry or governmental requirements for maintaining the privacy of users. In particular, identification information data should be managed and handled so as to minimize risks of unintentional or unauthorized access or use, and the nature of authorized use should be clearly indicated to users. Where possible, such identification information may be abstracted, such as by using some but not all bits in a byte of information, so that the resulting identification is not globally unique but still sufficient to facilitate communication under reasonable device usage scenarios.

Control circuitry 16 has external object measurement circuitry 41 that may be used to detect external objects adjacent to device 12 (e.g., on the top of a charging surface). Circuitry 41 may detect foreign objects such as coils, paper clips, and other metallic objects and may detect the presence of wireless power receiving devices 24 (e.g., circuitry 41 can detect the presence of one or more coils 48). In arrangements in which device 12 forms a charging puck, the charging puck may have a surface shape that mates with the shape of device 24. A puck or other device 12 may, if desired, have magnets (sometimes referred to as magnetic alignment structures) that removably attach device 12 to device 24, in the process aligning coil 48 with coil 36 for efficient wireless charging.

During object detection and characterization operations, external object measurement circuitry 41 can be used to make measurements on coils 36 to determine whether any devices 24 are present on device 12. Additional coils (that are not used for power transmission) and/or other additional sensors may be used for object detection and characterization operations if desired.

In an illustrative arrangement, measurement circuitry 41 of control circuitry 16 contains signal generator circuitry (e.g., oscillator circuitry for generating AC probe signals at one or more probe frequencies, a pulse generator that can create impulses so that impulse responses can be measured to gather inductance information, Q-factor information, etc.) and signal detection circuitry (e.g., filters, analog-to-digital converters, impulse response measurement circuits, etc.). During measurement operations, switching circuitry in device 12 (e.g., in the puck of device 12) may be adjusted by control circuitry 16 to switch each of coils 36 into use. As each coil 36 is selectively switched into use, control circuitry 16 uses the signal generator circuitry of signal measurement circuitry 41 to apply a probe signal to that coil while using the signal detection circuitry of signal measurement circuitry 41 to measure a corresponding response. Measurement circuitry 43 in control circuitry 30 and/or in control circuitry 16 may also be used in making current and voltage measurements (e.g., so that this information can be used by device 24 and/or device 12).

Figure 2:
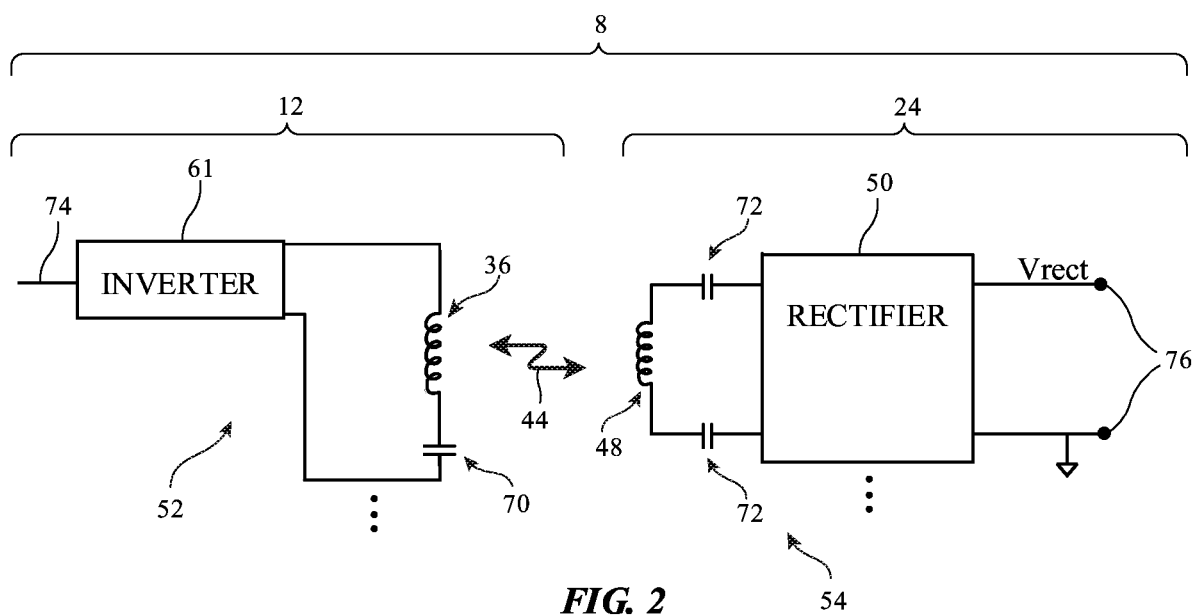
FIG. 2 is a circuit diagram of illustrative wireless power transmitting and receiving circuitry in accordance with an embodiment.

FIG. 2 is a circuit diagram of illustrative wireless charging circuitry for system 8. As shown in FIG. 2, circuitry 52 may include inverter circuitry such as one or more inverters 61 or other drive circuitry that produces wireless power signals that are transmitted through an output circuit that includes one or more coils 36 and capacitors such as capacitor 70. In some embodiments, device 12 may include multiple individually controlled inverters 61, each of which supplies drive signals to a respective coil 36. In other embodiments, an inverter 61 is shared between multiple coils 36 using switching circuitry.

During operation, control signals for inverter(s) 61 are provided by control circuitry 16 at control input 74. A single inverter 61 and single coil 36 is shown in the example of FIG. 2, but multiple inverters 61 and multiple coils 36 may be used, if desired. In a multiple coil configuration, switching circuitry (e.g., multiplexer circuitry) can be used to couple a single inverter 61 to multiple coils 36 and/or each coil 36 may be coupled to a respective inverter 61. During wireless power transmission operations, transistors in one or more selected inverters 61 are driven by AC control signals from control circuitry 16. The relative phase between the inverters can be adjusted dynamically (e.g., a pair of inverters 61 may produce output signals in phase or out of phase (e.g., 180 degrees out of phase).

The application of drive signals using inverter(s) 61 (e.g., transistors or other switches in circuitry 52) causes the output circuits formed from selected coils 36 and capacitors 70 to produce alternating-current electromagnetic fields (signals 44) that are received by wireless power receiving circuitry 54 using a wireless power receiving circuit formed from one or more coils 48 and one or more capacitors 72 in device 24.

If desired, the relative phase between driven coils 36 (e.g., the phase of one of coils 36 that is being driven relative to another adjacent one of coils 36 that is being driven) may be adjusted by control circuitry 16 to help enhance wireless power transfer between device 12 and device 24. Rectifier circuitry 50 is coupled to one or more coils 48 (e.g., a pair of coils) and converts received power from AC to DC and supplies a corresponding direct current output voltage Vrect across rectifier output terminals 76 for powering load circuitry in device 24 (e.g., for charging battery 58, for powering a display and/or other input-output devices 56, and/or for powering other components). A single coil 48 or multiple coils 48 may be included in device 24. In an illustrative configuration, device 24 may be a stylus or other portable device with at least two coils 48. These two (or more) coils 48 may be used together when receiving wireless power. Other configurations may be used, if desired.

As previously mentioned, in-band transmissions using coils 36 and 48 may be used to convey (e.g., transmit and receive) information between devices 12 and 24. With one illustrative configuration, frequency-shift keying (FSK) is used to transmit in-band data from device 12 to device 24 and amplitude-shift keying (ASK) is used to transmit in-band data from device 24 to device 12. Power may be conveyed wirelessly from device 12 to device 24 during these FSK and ASK transmissions (e.g., at least some wireless power is conveyed during the in-band communications, whether or not devices 12 and 24 have completed a handshake process and agreed upon a sustained power transfer level). While power transmitting circuitry 52 is driving AC signals into one or more of coils 36 to produce signals 44 at the power transmission frequency, wireless transceiver circuitry 40 may use FSK modulation to modulate the power transmission frequency of the driving AC signals and thereby modulate the frequency of signals 44. In device 24, coil 48 is used to receive signals 44. Power receiving circuitry 54 uses the received signals on coil 48 and rectifier 50 to produce DC power. At the same time, wireless transceiver circuitry 46 monitors the frequency of the AC signal passing through coil(s) 48 and uses FSK demodulation to extract the transmitted in-band data from signals 44. This approach allows FSK data (e.g., FSK data packets) to be transmitted in-band from device 12 to device 24 with coils 36 and 48 while power is simultaneously being wirelessly conveyed from device 12 to device 24 using coils 36 and 48.

In-band communications between device 24 and device 12 may use ASK modulation and demodulation techniques. Wireless transceiver circuitry 46 transmits in-band data to device 12 by using a switch (e.g., one or more transistors in transceiver 46 that are coupled coil 48) to modulate the impedance of power receiving circuitry 54 (e.g., coil 48). This, in turn, modulates the amplitude of signal 44 and the amplitude of the AC signal passing through coil(s) 36. Wireless transceiver circuitry 40 monitors the amplitude of the AC signal passing through coil(s) 36 and, using ASK demodulation, extracts the transmitted in-band data from these signals that was transmitted by wireless transceiver circuitry 46. The use of ASK communications allows ASK data bits (e.g., ASK data packets) to be transmitted in-band from device 24 to device 12 with coils 48 and 36 while power is simultaneously being wirelessly conveyed from device 12 to device 24 using coils 36 and 48.

The example of FSK modulation being used to convey in-band data from power transmitting device 12 to power receiving device 24 and ASK modulation being used to convey in-band data from power receiving device 24 to power transmitting device 12 is merely illustrative. In general, any desired communication techniques may be used to convey information from power transmitting device 12 to power receiving device 24 and from power receiving device 24 to power transmitting device 12.

Figure 3A:
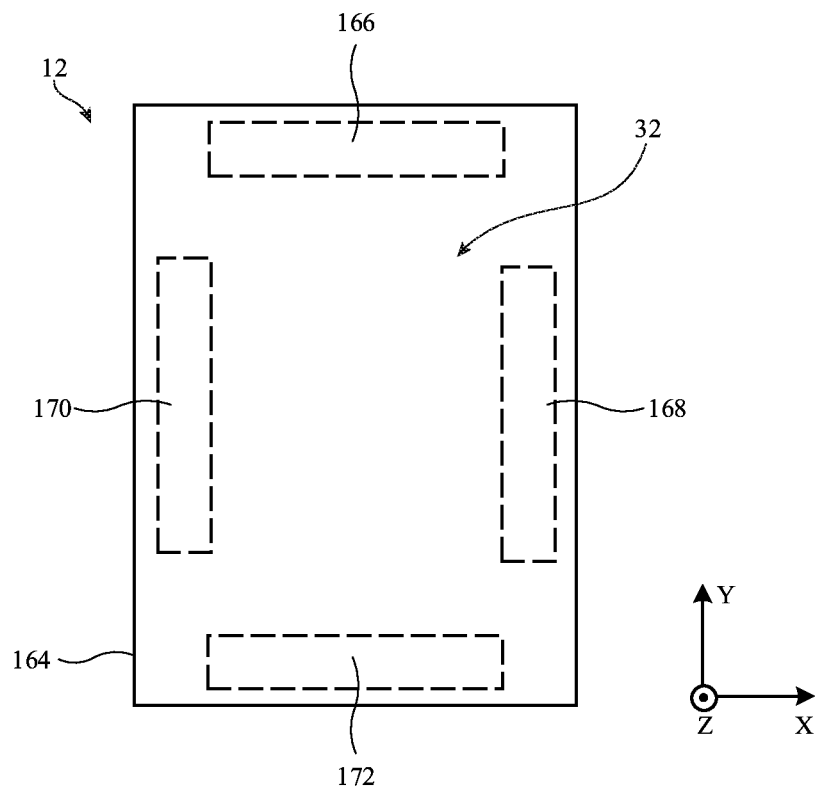
FIGS. 3A and 3B are top and cross-sectional side views respectively of an illustrative device in a wireless charging system in accordance with an embodiment.
Figure 3B:
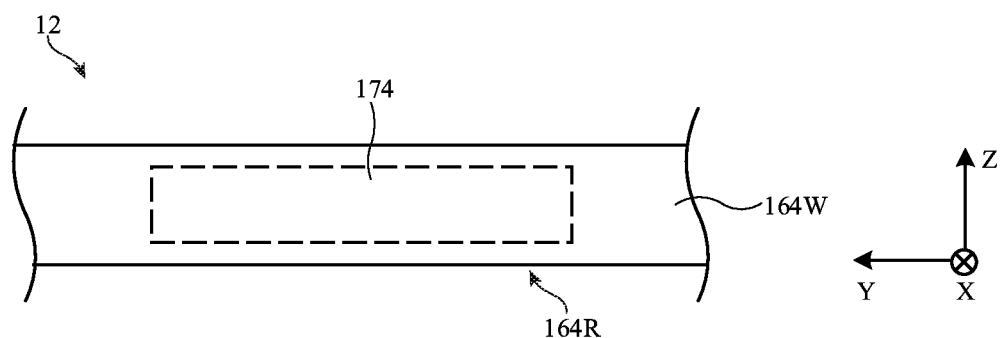

In the illustrative configuration of FIGS. 3A and 3B, which is sometimes described herein as an example, device 12 is a tablet computer or other device with a display. Device 12 may transmit wireless power to an additional device such as a computer stylus. A user can use the stylus to draw or write on tablet computer 12 and to provide other input to tablet computer 12.

FIG. 3A is a top view of device 12 and FIG. 3B is a cross-sectional side view of device 12. As shown in FIG. 3A, tablet computer 12 may include a housing such as housing 164 in which display 32 is mounted. Additional input-output devices (such as a button) may also be used to supply input to tablet computer 12. Display 32 may be a capacitive touch screen display or a display that includes other types of touch sensor technology. The touch sensor of display 32 may be configured to receive input from a stylus. The stylus may also receive wireless power from device 12.

The stylus may have a cylindrical shape or other elongated body that extends along a longitudinal axis. The body of the stylus may be formed from metal and/or plastic tubes and other elongated structures. The stylus may have a tip that contains a conductive elastomeric member that is detected by a touch sensor of the display in tablet computer 12. If desired, the tip may contain active electronics (e.g., circuitry that transmits signals that are capacitively coupled into the touch sensor of the display and that are detected as touch input on the touch sensor).

The stylus may include a shaft portion that couples the tip to an opposing end of the stylus. The end opposite the tip may contain a conductive elastomeric member, active electronics (e.g., circuitry that transmits signals that are capacitively coupled into the touch sensor of the tablet display and that are detected as touch input on the touch sensor), buttons, a metal connector that mates with an external plug, or other input-output components.

A force sensor may be incorporated into the stylus tip and/or the opposing end of the stylus. A force sensor may be used to measure how forcefully a user is pressing the stylus against the outer surface of the display of device 12. Force data may then be wirelessly transmitted from the stylus to tablet 12 so that the thickness of a line that is being drawn on the tablet display can be adjusted accordingly or so that device 12 may take other suitable action.

Housing 164 of tablet 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 164 may be formed using a unibody configuration in which some or all of housing 164 is machined or molded as a single structure or may be formed using multiple structures (e.g., an internal frame structure, one or more structures that form exterior housing surfaces, etc.). In the example of FIGS. 3A and 3B, housing 164 includes a conductive peripheral sidewall structure 164W that surrounds a periphery of tablet 12. Housing 164 may, if desired, include a conductive rear wall structure 164R that opposes display 32 (e.g., conductive rear wall structure 164R may form the rear exterior face, side, or surface of tablet 12). If desired, rear wall 164R and sidewalls 164W may be formed from a continuous structure (e.g., in a unibody configuration) or from separate structures. Openings may be formed in housing 164 to form communications ports, holes for buttons, and other structures if desired. Rear wall 164R and/or sidewalls 164W may be formed from metal or dielectric materials such as ceramics, plastic, or glass.

Display 32 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 32 (sometimes referred to as a screen) may have an active area that includes an array of display pixels. The array of pixels may be formed from liquid crystal display (LCD) components, an array of electrophoretic pixels, an array of plasma display pixels, an array of organic light-emitting diode display pixels or other light-emitting diode pixels, an array of electrowetting display pixels, or display pixels based on other display technologies.

Display 32 may be protected using a display cover layer such as a layer of transparent glass, clear plastic, transparent ceramic, sapphire, or other transparent crystalline material, or other optically transparent layer(s). The display cover layer may have a planar shape, a convex curved profile, a shape with planar and curved portions, a layout that includes a planar main area surrounded on one or more edges with a portion that is bent out of the plane of the planar main area, or other suitable shapes. The display cover layer may cover the entire front face of tablet 12 (e.g., extending across an entirety of a length dimension of tablet 12 parallel to the y-axis and a width dimension of tablet 12 parallel to the x-axis of FIGS. 3A and 3B). Sidewalls 164W may extend from a rear face of tablet 12 formed by rear wall 164R to the display cover layer (e.g., extending across a height dimension of tablet 12 parallel to the z-axis of FIGS. 3A and 3B). In another suitable arrangement, the display cover layer may cover substantially all of the front face of tablet 12 or only a portion of the front face of tablet 12. Openings may be formed in the display cover layer. For example, an opening may be formed in the display cover layer to accommodate a button. An opening may also be formed in the display cover layer to accommodate ports such as a speaker port.

Housing 164 may have four peripheral edges (e.g., sidewalls 164W). One or more wireless power transmitting coils 36 may be mounted within housing 164 behind display 32. If desired, one or more wireless power transmitting coils 36 may be mounted behind display 32 and adjacent to one of the four peripheral edges. For example, one or more coils 36 may be mounted behind display 32 within peripheral edge region 166, within peripheral edge region 168, within peripheral edge region 170, and/or within peripheral edge region 172. When mounted behind display 32, coils 36 may wirelessly convey power to a stylus through display 32 when the stylus is placed onto the surface of display 32. In these examples, transmitting coils are positioned behind the screen such that the stylus is placed on a display area (active area) of the screen (e.g., a light-emitting area of the screen) and receives wireless power through the display area during wireless charging. These examples are merely illustrative. In another possible embodiment, the stylus may be placed in a border area (inactive area) of the screen (e.g., an area of the screen without light-emitting pixels that extends around one or more sides of the periphery of the screen) during charging and may receive wireless power from transmitting coils through the border area. The border area may be interposed between the display area of the screen and an edge of the electronic device.

Consider an example in which a wireless power transmitting coil 36 is formed within region 168 of tablet 12. In this scenario, when it is desired to charge a stylus, a user may place the stylus onto the surface of display 32 within region 168 (e.g., so that the stylus shaft lies on the surface of display 32 and is aligned with the y-axis of FIG. 3A). When the stylus is placed onto display 32 within region 168 (e.g., directly on the front face of the electronic device), a wireless power receiving coil in the stylus (e.g., coil 48 in FIG. 1) may be aligned with a wireless power transmitting coil 36 in region 168. When aligned, wireless power signals 44 may be transmitted from tablet computer 12 to the stylus. The wireless power received by the stylus may be used to charge a battery (e.g., battery 58 in FIG. 1). Once battery 58 has become sufficiently charged, the user may pick up the stylus and continue to use the stylus to provide user input to tablet 12.

If desired, alignment structures may be formed within regions 166, 168, 170, and/or 172 to help ensure that receiving coil(s) 48 on the stylus are aligned with transmitting coil(s) 36 on tablet 12 when the stylus is placed on the surface of display 32. Examples of such alignment structures include magnetic alignment structures, indentations or grooves formed on the front face of display 32, clip structures, adhesive structures, or any other desired alignment structures. In the example where transmitting coils are located within region 168, magnetic alignment structures may be formed within or adjacent to region 168 and under display 32 if desired. The magnetic alignment structures may attract conductive or magnetic structures on the stylus to snap and hold the stylus into a position at which coils 36 and 48 are aligned.

If desired, one or more wireless power transmitting coils 36 may be mounted within tablet 12 adjacent to housing sidewalls 164W such as within region 174 of FIG. 3B. In scenarios where housing sidewalls 164W are formed from conductive material, a dielectric window may be formed within the sidewalls. Transmitting coils 36 may be mounted behind the dielectric windows to allow wireless power to be transferred to the stylus when the stylus is placed adjacent to the dielectric window or adjacent to the dielectric sidewall.

The example of FIGS. 3A and 3B is merely illustrative. If desired, one or more wireless power transmitting coils 36 may be formed adjacent to rear housing wall 164R for charging stylus 24 through rear wall 164R. In scenarios where rear housing wall 164R is formed from conductive materials, dielectric windows may be formed within rear housing wall 164R and coils 36 may transmit wireless power to a stylus through the dielectric windows in rear housing wall 164R. In another suitable arrangement, rear housing wall 164R may be formed from dielectric (e.g., a dielectric cover layer that forms the rear face of the tablet). In general, wireless power transmitting coils 36 may be formed at any desired location along display 32, along housing sidewalls 164W, and/or along rear housing wall 164R. Locating transmitting coils 36 along the periphery of display 32 such as in regions 166, 168, 170, and 172 may allow the stylus to be placed on the surface of display 32 without blocking an excessive amount of the viewing region of display 32 (e.g., so that a user can still view images displayed using display 32 while the stylus is being charged). However, in general, wireless power transmitting coils 36 may be located at any desired location along the surface of display 32. Wireless power transmitting coils 36 may be located along any of the four peripheral sidewalls 164W of tablet 12.

In this example, a tablet computer serves as a wireless power transmitting device that transmits wireless power to an external device such as a stylus. This example is merely illustrative. Instead, or in addition, a tablet computer may include power receiving coils for receiving wireless power. The power receiving coils (e.g., coils 48) may be positioned adjacent to a dielectric portion of rear housing wall 164R, as one example.

Figure 4:
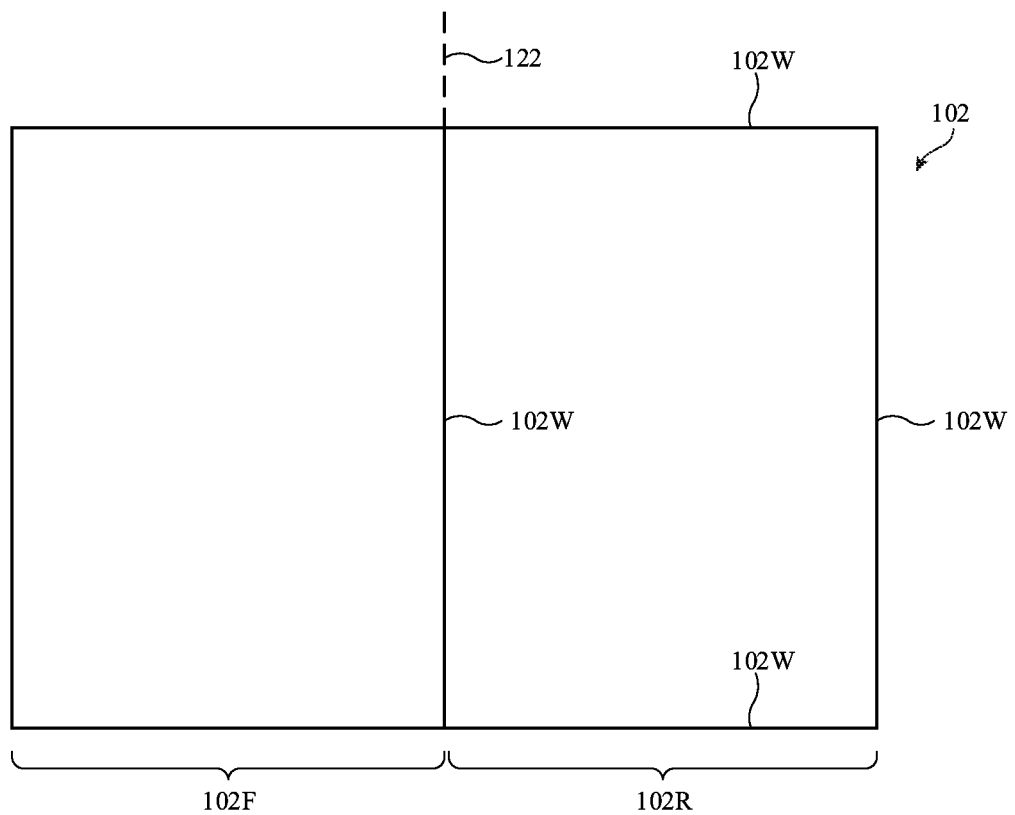
FIG. 4 is a top view of an illustrative removable case having a front cover portion in accordance with an embodiment.

As shown in FIG. 4, the wireless charging system may also include a removable cover 102. Removable cover 102 (sometimes referred to as removable case) may have any suitable shape that allows cover 102 to mate with device 12. In the example of FIG. 4, cover 102 has a folio shape (sometimes referred to as a folio cover) with a rear portion 102R and front portion 102F (sometimes referred to as first and second portions). Rear portion 102R may have a rectangular recess with a rear wall surrounded by peripheral sidewalls 102W or other suitable structures (straps, clips, a sleeve, corner pockets, etc.) that allow cover 102 to receive and couple to device 12.

The portion of cover 102 that extends along fold axis 122 between rear portion 102R and front portion 102F may have hinge structures (e.g., flexible cover material that serves as a hinge or other hinge structures that couple portions 102F and 102R while allowing these portions to rotate relative to each other). In some configurations, additional bendable portions may be provided. For example, front portion 102F may have one or more flexible strips. Each flexible strip allows additional folds to be formed in cover 102 (e.g., to manipulate the cover into one or more stand configurations and prop device 12 at a desired angle while cover 102 is coupled to device 12). Each flexible strip may extend parallel to fold axis 122 from one side of the front portion 102F to another side of front portion 102F.

When it is desired to protect device 12 in cover 102, device 12 (e.g., housing 164 of device 12) may be press fit into a recess formed by the sidewalls 102W and/or rear wall of cover 102, coupled to cover 102 using magnets, clips, or straps, or otherwise coupled to cover 102. Cover 102 may be formed from fabric, leather, polymer, other materials, and/or combinations of these materials.

Figure 5:
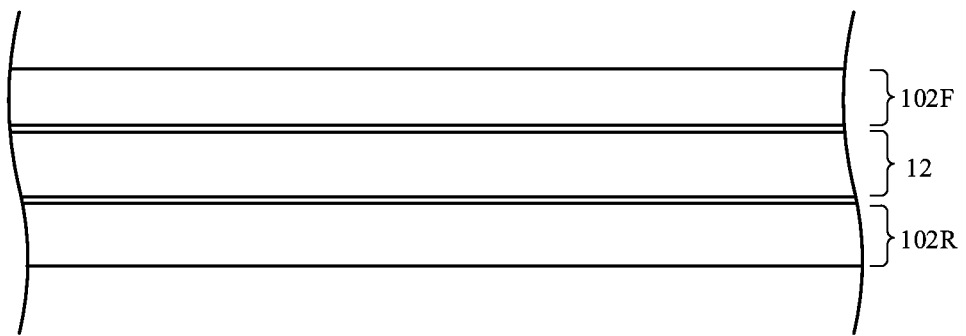
FIG. 5 is a cross-sectional side view of the illustrative removable case of FIG. 4 in accordance with an embodiment.

FIG. 5 is a cross-sectional side view showing device 12 held in removable cover 102. In FIG. 5, the front portion 102F of cover 102 is folded over and covers the front face of device 12. Accordingly, front portion 102F of cover 102 covers the display (32) of device 12. This may protect the display from damage. In certain arrangements, device 12 may need to transmit and/or receive wireless charging signals through cover 102. For example, a stylus may be configured to be placed on the display for wireless charging (e.g., in one of regions 166, 168, 170, and 172 in FIG. 3A). Since front portion 102F covers the display, the stylus may instead be placed on the front portion 102F of the cover 102 instead of directly on the front face of the electronic device. Wireless power signals are then conveyed from device 12 to the stylus (e.g., receiving device 24) through cover 102.

The presence of dielectric cover 102 between devices 12 and 24 during wireless charging may decrease charging efficiency (due to an increased distance between devices 12 and 24). To maintain charging efficiency between devices 12 and 24 with or without the presence of cover 102, cover 102 may include ferrite pieces in front cover portion 102F. The ferrite pieces may overlap a wireless charging area and serve to relay magnetic flux between the transmitting device and receiving device, as will be discussed later in greater detail.

The example in FIGS. 4 and 5 of removable case 102 being a removable cover having a cover portion (102F) configured to fold over and cover the display of device 12 is merely illustrative. In some arrangements, the front cover portion 102F may be omitted from the removable case. An arrangement of this type is shown in FIG. 6.

Figure 6:
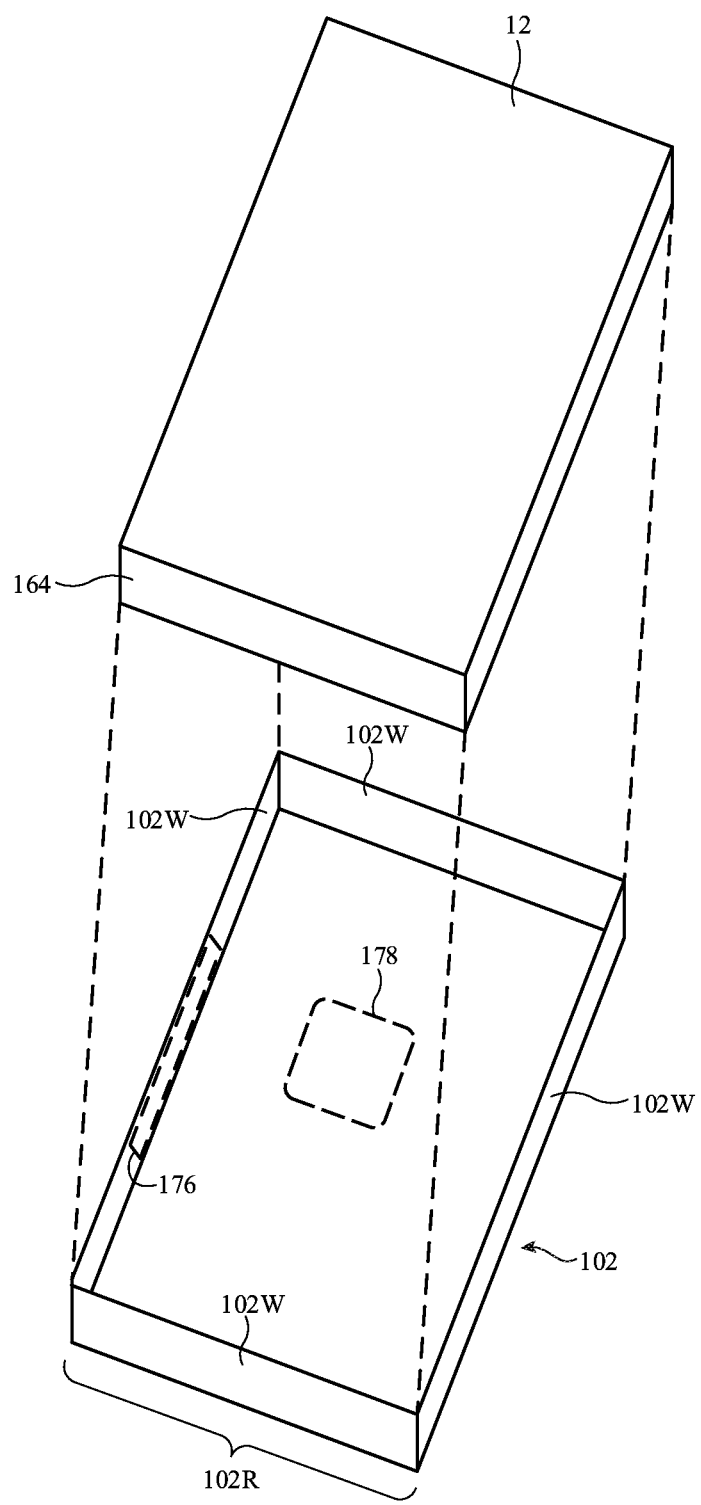
FIG. 6 is a perspective view of an illustrative wireless charging system that includes an electronic device and a removable case without a front cover portion in accordance with an embodiment.

As shown in FIG. 6, removable case 102 may include a rear portion 102R (e.g., configured to cover a rear housing wall of device 12, sometimes referred to as rear wall) and sidewalls 102W (e.g., four peripheral sidewalls that extend from the rear wall). The sidewalls 102W may form a recess that is configured to receive and secure device 12 within the removable case 102. When it is desired to protect device 12 in case 102, device 12 (e.g., housing 164 of device 12) may be press fit into a recess formed by the sidewalls 102W of case 102, coupled to case 102 using magnets, clips, or straps, or otherwise coupled to case 102. Case 102 may be formed from fabric, leather, polymer, metal other materials, and/or combinations of these materials.

In general, wireless power signals may be conveyed (e.g., transmitted or received) through cover 102. Consider an example where device 12 transmits wireless power signals to a stylus through an edge of the device housing (e.g., region 174 in FIG. 3B). When the device is coupled to removable case 102, the stylus may be placed on corresponding region 176 on sidewall 102W of case 102. Device 12 may transmit wireless power signals to the stylus through region 176 of cover 102. Device 12 may also transmit wireless power signals to the stylus through a display area or border area of the screen and then through the front portion of the cover.

In another example, a tablet computer may include a wireless power receiving coil at a rear surface. In this situation, the tablet computer serves as a wireless power receiving device and may receive wireless power from a wireless power transmitting device such as a wireless charging mat or wireless charging puck. The tablet computer may still be coupled to a case 102 (e.g., of the type shown in FIGS. 4 and 5 or FIG. 6). When the tablet computer is coupled to a case 102, rear portion 102R of the case may be interposed between the tablet computer and the wireless charging mat. The tablet computer may therefore receive wireless power signals through a region 178 on rear portion 102R of case 102.

Figure 7:
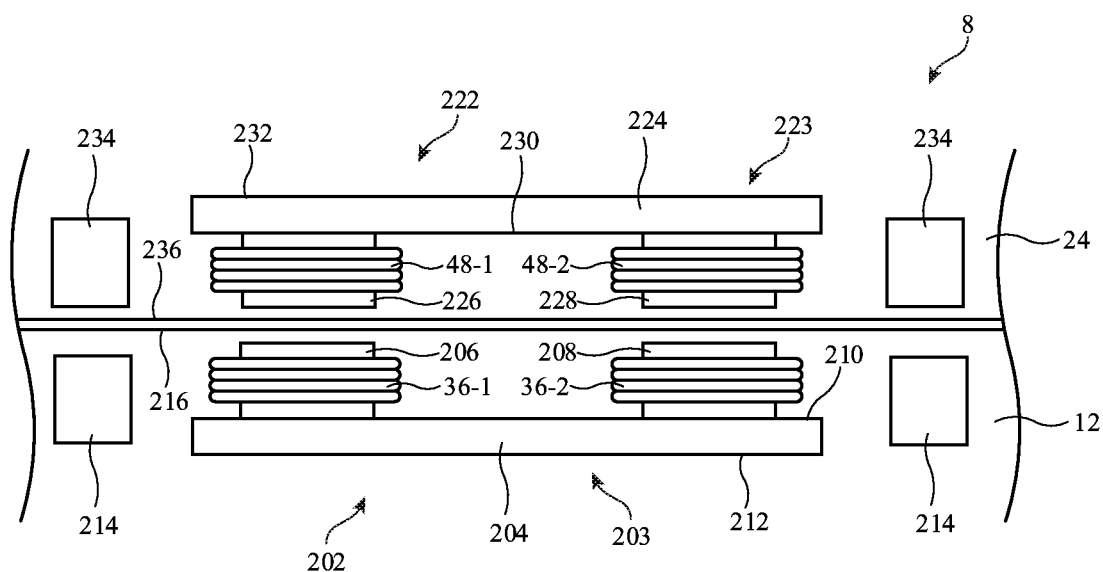
FIG. 7 is a side view of an illustrative wireless charging system with a wireless power transmitting device that is directly adjacent to a wireless power receiving device in accordance with an embodiment.

FIG. 7 shows an example of a wireless charging system 8 with a wireless power receiving device that is directly adjacent to a wireless power transmitting device (without an intervening case). As shown, a power transmitting assembly 202 (e.g., part of power transmitting circuitry 52) is included within wireless power transmitting device 12. The power transmitting assembly (sometimes referred to as an inductive power transmitting assembly) includes a magnetic core 203 having a base 204, a first limb 206, and a second limb 208. A first coil 36-1 is wound about the first limb 206 and a second coil 36-2 is wound about the second limb 208. Coils 36-1 and 36-2 may be coupled to inverter circuitry (e.g., inverter 61 in FIG. 1). The inverter circuitry can drive the coils 36-1 and 36-2 to generate magnetic flux. During operation, the first coil 36-1 and second coil 36-2 can be driven to generate magnetic flux having opposing polarity.

Magnetic core base 204 has a front surface 210 and a rear surface 212. The coils 36-1 and 36-2 may each be wound about the respective limbs 206 and 208 circumferentially along the axis of the respective limb (e.g., in the direction that the limb extends from the front surface 210 of the base 204). The coils may be wound from a single-strand conductor, a multiple strand conductor having multiple wires connected in parallel, braided wire, Litz wire, a conductive ink or conductive trace such as multilayer tracks on a printed circuit board, or other conductive elements suitable for forming coils.

A power receiving assembly 222 (e.g., part of power receiving circuitry 54) is included within wireless power receiving device 24. The power receiving assembly (sometimes referred to as an inductive power receiving assembly) includes a magnetic core 223 having a base 224, a first limb 226, and a second limb 228. A first coil 48-1 is wound about the first limb 226 and a second coil 48-2 is wound about the second limb 228. Coils 48-1 and 48-2 may be coupled to rectifier circuitry (e.g., rectifier 50 in FIG. 1). The rectifier circuitry converts received AC signals from coils 48-1 and 48-2 into DC voltage signals for powering device 24.

Magnetic core base 224 has a front surface 230 and a rear surface 232. The coils 48-1 and 48-2 may each be wound about the respective limbs 226 and 228 circumferentially along the axis of the respective limb (e.g., in the direction that the limb extends from the front surface 230 of the base 224). Coils 48-1 and 48-2 may be wound from a single-strand conductor, a multiple strand conductor having multiple wires connected in parallel, braided wire, Litz wire, a conductive ink or conductive trace such as multilayer tracks on a printed circuit board, or other conductive elements suitable for forming coils.

Alignment structures such as magnetic alignment structures 214 and 234 may optionally be included in the system. As shown in FIG. 7, wireless power transmitting device 12 may have magnetic alignment structures 214. Wireless power receiving device 24 may have magnetic alignment structures 234. Each magnetic alignment structure 214 in the transmitting device may magnetically couple with a corresponding magnetic alignment structure 234 in the receiving device. When the transmitter alignment structures 214 are coupled to the receiver alignment structures 234, the transmitting coils 36 may be aligned with the receiving coils 48. Therefore, the magnetic alignment structures ensure proper alignment of the receiving coils relative to the transmitting coils. Magnetic alignment structures 214 and 234 may be permanent magnets (e.g., formed from hard magnetic materials that retain their magnetism over time).

The example of a power transmitting assembly and power receiving assembly shown in FIG. 7 is merely illustrative. In general, the power transmitting assembly and power receiving assembly may have any desired design. In one alternative possible arrangement, the magnetic core of the power transmitting assembly and/or power receiving assembly may have a pot-core design (e.g., an enclosure with a ring-shaped hollow portion that receives the coil). In yet another possible arrangement, the power transmitting assembly and/or power receiving assembly may include a winding on a bar-shaped ferrite. Any desired magnetic core and coil design may be used (e.g., a U-shaped core, a C-shaped core, an E-shaped core, a toroidal core, etc.).

In general, each device may have only 1 coil, two coils (as in FIG. 7), three coils, more than three coils, etc. One or both devices may include a transverse coil (e.g., a coil extending along the magnetic core base between the two magnetic core limbs). The precise geometry of the coils and magnetic cores in devices 12 and 24 may be tailored to the specific design. Wireless power receiving device 24 may be designed to cooperate specifically with wireless power transmitting device 12. This is, however, merely illustrative. Power receiving device 24 may, in comes cases, not be specifically designed to cooperate with power transmitting device 12. In general, each device may have different coil arrangements, different (or no) magnetic elements (e.g., magnetic cores), different coil and magnetic element sizes, different coil and magnetic element shapes, and other different characteristics.

In FIG. 7, wireless power receiving device 24 is placed directly on wireless power transmitting device 12. For example, as shown, outer surface 236 of power receiving device 24 may be directly adjacent to and in direct contact with outer surface 216 of power transmitting device 12. This may occur when, for example, a stylus is placed on an outer surface of a tablet computer for charging (as discussed in connection with FIGS. 3A and 3B).

When either power receiving device 24 or power transmitting device 12 is contained within a removable case, there may be an intervening layer between the outer surfaces of power receiving device 24 and power transmitting device 12 during charging. An arrangement of this type is shown in FIG. 8A.

Figure 8A:
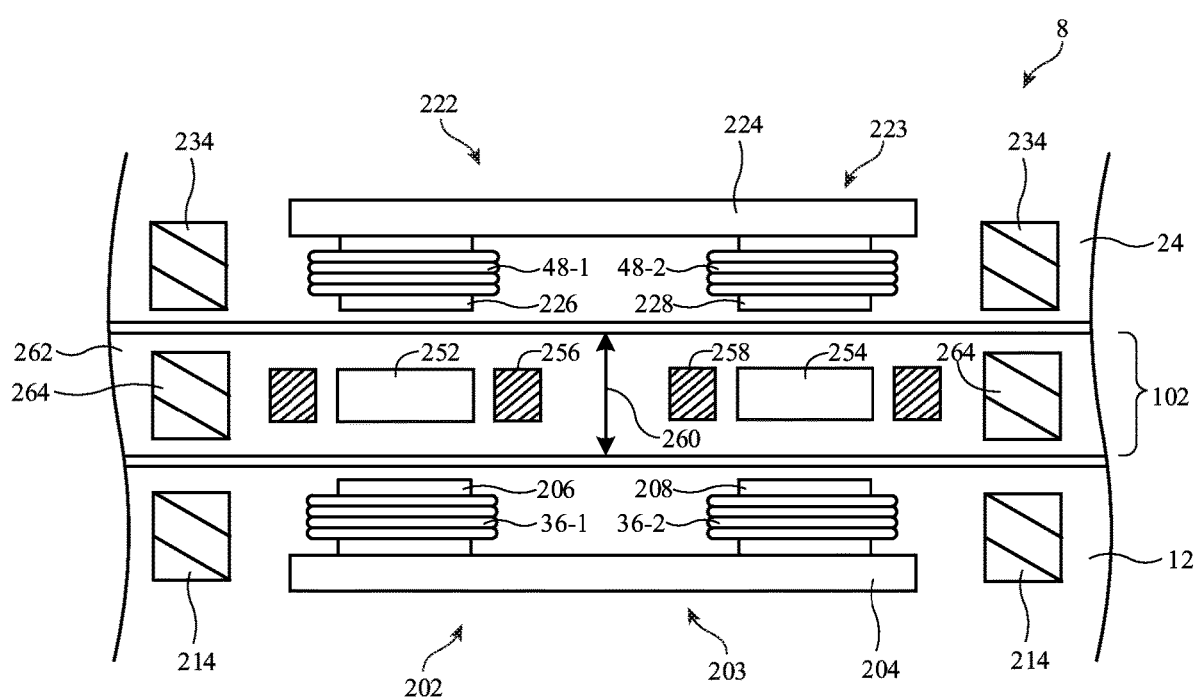
FIGS. 8A and 8B are side views of an illustrative wireless charging system with a removable case that is interposed between a wireless power transmitting device and a wireless power receiving device in accordance with an embodiment.

As shown in FIG. 8A, case 102 may be interposed between wireless power transmitting device 12 and wireless power receiving device 24. The case may include a dielectric material 262 (e.g., a bulk dielectric material) such as fabric, leather, polymer (e.g., polyurethane), other materials, and/or combinations of these materials. Dielectric material 262 of case 102 may have a thickness 260 between the power transmitting device 12 and power receiving device 24. The larger the magnitude of thickness 260, the greater the separation between the power transfer assembly 202 in power transmitting device 12 and the power receiving assembly 222 in power receiving device 24. Without any additional components in case 102, this increased separation leads to a drop in wireless power transfer efficiency between devices 12 and 24. However, as shown in FIG. 8A, case 102 may include embedded components to maintain the wireless power transfer efficiency even when case 102 is present.

Case 102 includes a magnetic core 252 that is interposed between transmitting coil 36-1 and limb 206 in transmitting device 12 and receiving coil 48-1 and limb 226 in receiving device 24. Case 102 also includes a magnetic core 254 that is interposed between transmitting coil 36-2 and limb 208 in transmitting device 12 and receiving coil 48-2 and limb 228 in receiving device 24. Magnetic cores 252 and 254 have a high magnetic permeability and therefore lower the magnetic reluctance between the transmitting device and the receiving device. The magnetic field lines are concentrated in the magnetic cores 252 and 254 through case 102. In other words, magnetic cores 252 and 254 route magnetic flux from one surface of the case (adjacent to the power transmitting device) to another surface of the case (adjacent to the power receiving device). Magnetic cores 252 and 254 may therefore sometimes be referred to as magnetic relays 252 and 254 (because they form a low reluctance path that relays magnetic flux between the transmitter and receiver).

Magnetic cores 252 and 254 may be positioned in areas of case 102 that have a high magnetic flux density during power transfer operations between devices 12 and 24. As shown, magnetic core 252 may overlap limb 206 in device 12 and limb 226 in device 24, which may be an area of high magnetic flux density. Magnetic core 254 may overlap limb 208 in device 12 and limb 228 in device 24, which may be an area of high magnetic flux density. The magnetic cores may be embedded in dielectric material 262 such that the magnetic cores 252 and 254 are entirely surrounded by and in direct contact with dielectric material 262. This example is merely illustrative. In an alternate arrangement, the cores may be laterally surrounded by dielectric material 262 and may have one or more exposed surfaces on the upper/lower surfaces of case 102.

Case 102 may include magnetic alignment structures 264 to ensure proper alignment between the power transfer assembly 202 and power reception assembly 222. Magnetic alignment structures 264 (which may be permanent magnets) magnetically couple with a corresponding magnetic alignment structure 214 in the transmitting device. Magnetic structures 264 may also magnetically couple with a corresponding magnetic alignment structure 234 in the receiving device. When the alignment structures 264 in the case are coupled to the alignment structures 214 and 234, the transmitting coils 36, magnetic cores 252, and receiving coils 48 may all be aligned. Therefore, the magnetic alignment structures ensure proper alignment of the receiving coils relative to the transmitting coils and proper alignment of the magnetic relays 252 and 254 relative to the coils.

In general, magnetic relays 252 and 254 may have any desired thickness and shape. The thickness and shape of each magnetic relay may be optimized to achieve targeted magnetic performance within the system.

The example of using magnetic alignment structures in case 102 to ensure proper alignment between the power transfer assembly 202 and power reception assembly 222 is merely illustrative. If desired, other types of alignment structures may be used for alignment structures 264 (e.g., indentations or grooves, clip structures, adhesive structures, or any other desired alignment structures).

The magnetic cores herein (e.g., 203, 223, 252, 254, 272, 274, and 276) may be formed from a soft magnetic material such as ferrite. The magnetic cores may have a high magnetic permeability, allowing them to guide the magnetic fields in the system. The example of using ferrite cores is merely illustrative. Other ferromagnetic and/or ferrimagnetic materials such as iron, mild steel, mu-metal (a nickel-iron alloy), a nanocrystalline magnetic material, rare earth metals, or other magnetic materials having a sufficiently high magnetic permeability to guide magnetic fields in the system may be used for one or more of the cores if desired. The magnetic cores may sometimes be referred to as ferrimagnetic cores. Magnetic cores 203, 223, 252, 254, 272, 274, and 276 may be a single piece or made from separate pieces. The cores may be molded, sintered, formed from laminations, formed from particles (e.g., ceramic particles) distributed in a polymer, or manufactured by other processes.

Case 102 may also optionally include shielding around each embedded magnetic core. FIG. 8A shows an example with shielding structure 256 formed in a circular ring around magnetic core 252 and shielding structure 258 formed in a ring around magnetic core 254. Shielding structures 256 and 258 (sometimes referred to as shielding, shielding rings, etc.) may be formed from an electromagnetic shielding material such as copper, brass, nickel, silver, steel, etc. The shielding structure may be ring-shaped and may laterally surround the magnetic cores. In other words, magnetic core 252 is formed in an opening (sometimes referred to as a central opening) defined by shielding ring 256 and magnetic core 254 is formed in an opening defined by shielding ring 258.

Figure 8B:
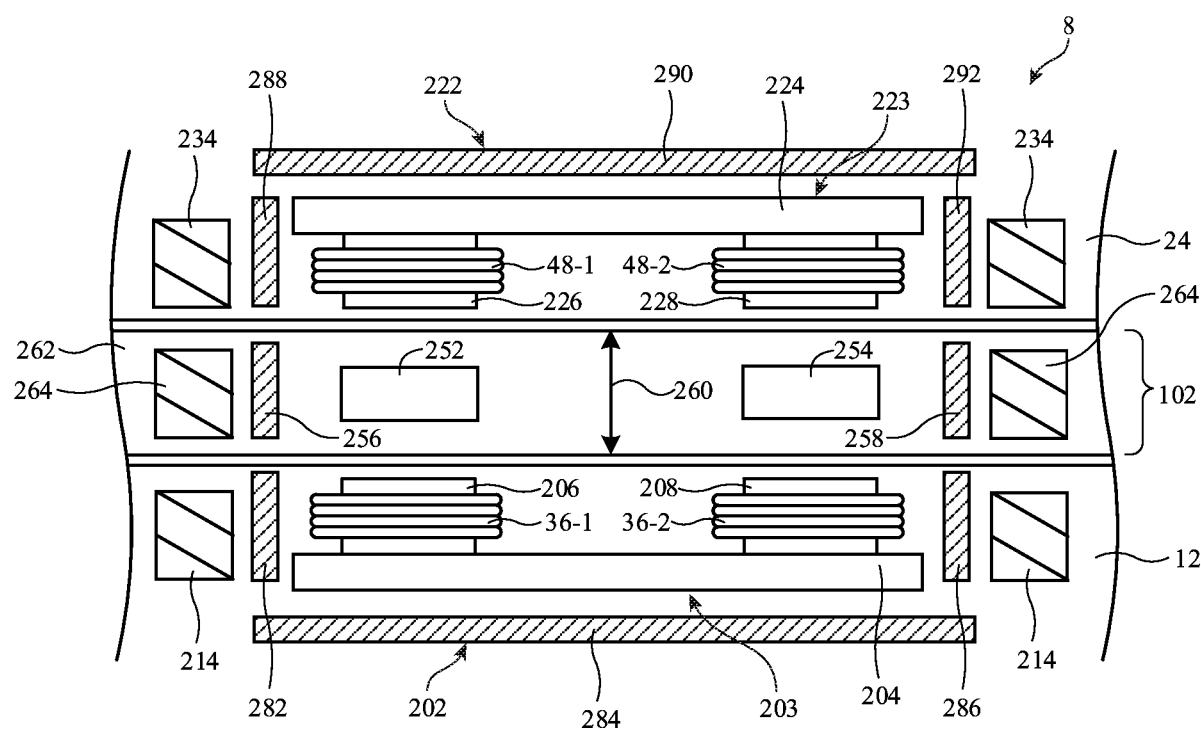

The example of shielding 256 and 258 being ring-shaped in FIG. 8A is merely illustrative. The presence of the shielding impacts the magnetic performance of the system. Therefore, the shape and thickness of each shielding portion may be selected to optimize performance of the system. As one example, shielding interposed between the cores 252 and 254 may be unnecessary. Therefore, in an alternate embodiment, shielding may be included only between the cores and adjacent permanent magnets 264. FIG. 8B is a cross-sectional side view showing an example of this type.

As shown in FIG. 8B, shielding 256 is interposed between magnetic core 252 and permanent magnet 264. Shielding 258 is interposed between magnetic core 254 and permanent magnet 264. Positioning the shielding in this way may help isolate cores 252 and 254 from the permanent magnets without adversely affecting the transfer of magnetic flux within the system.

FIG. 8B shows how shielding may also be incorporated in power transmitting device 12 and/or power receiving device 24. As shown, shielding pieces such as shielding 282, 284, and 286 may be incorporated around power transmitting assembly 202. Shielding 282 is interposed between magnetic core 206 and coil 36-1 and permanent magnet 214. Shielding 286 is interposed between magnetic core 208 and coil 36-2 and permanent magnet 214. Similarly, shielding pieces such as shielding 288, 290, and 292 may be incorporated around power receiving assembly 222. Shielding 288 is interposed between magnetic core 226 and coil 48-1 and permanent magnet 234. Shielding 292 is interposed between magnetic core 228 and coil 48-2 and permanent magnet 234. Similar to shielding 256 and 258, shielding structures 282, 284, 286, 288, 290, and 292 may be formed from an electromagnetic shielding material such as copper, brass, nickel, silver, steel, etc.

The example in FIG. 8B of separate shielding pieces surrounding the power transmitting/receiving assemblies is merely illustrative. In general, the power transmitting/receiving devices may include one or more shielding pieces in any desired configuration. For example, shielding 282, 284, and 286 in FIG. 8B may be formed integrally as one unitary shielding piece. One or more shielding pieces in power transmitting assembly 202 and/or power receiving assembly 222 may optionally have the same footprint as the shielding pieces in accessory 102. The shielding pieces may overlap in the vertical direction, as shown in FIG. 8B.

Figure 9A:
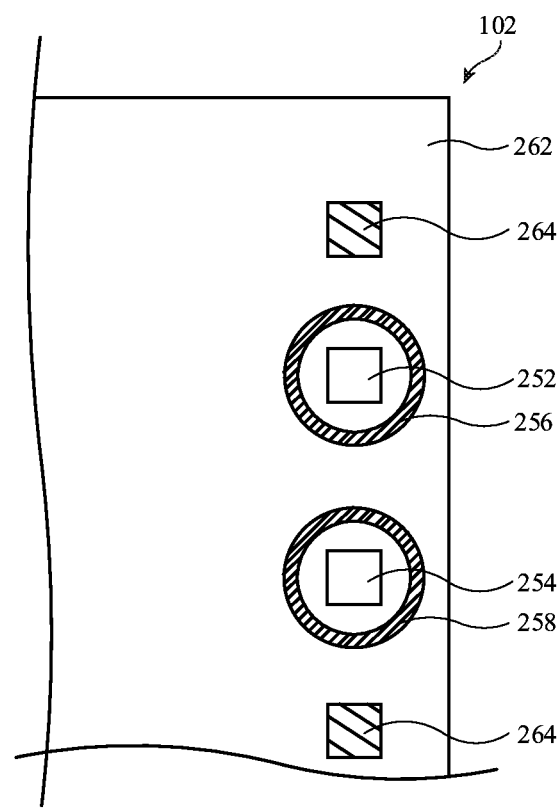
FIGS. 9A and 9B are top views of an illustrative removable cover with magnetic cores for relaying magnetic flux between a wireless power transmitting device and a wireless power receiving device in accordance with an embodiment.

FIG. 9A is a top view of case 102 in FIG. 8A, showing an illustrative arrangement for the components that are embedded in the case. In the example of FIG. 9A, shielding structure 256 forms a ring around magnetic core 252.

Shielding structure 258 forms a ring around magnetic core 254. When interposed between a power transmitting device and power receiving device, permanent magnets 264 may couple to permanent magnets in the adjacent devices and position magnetic cores 252 and 254 in an appropriate alignment. Magnetic cores 252 and 254 may be sized to accommodate potential alignment variations relative to the adjacent devices.

The example of magnetic alignment structures 264 being formed as two discrete pieces on either side of the magnetic cores is merely illustrative. If desired, magnetic alignment structures 264 may include a ring-shaped permanent magnet that laterally surrounds magnetic cores 252/254 and shielding structures 256/258.

Figure 9B:
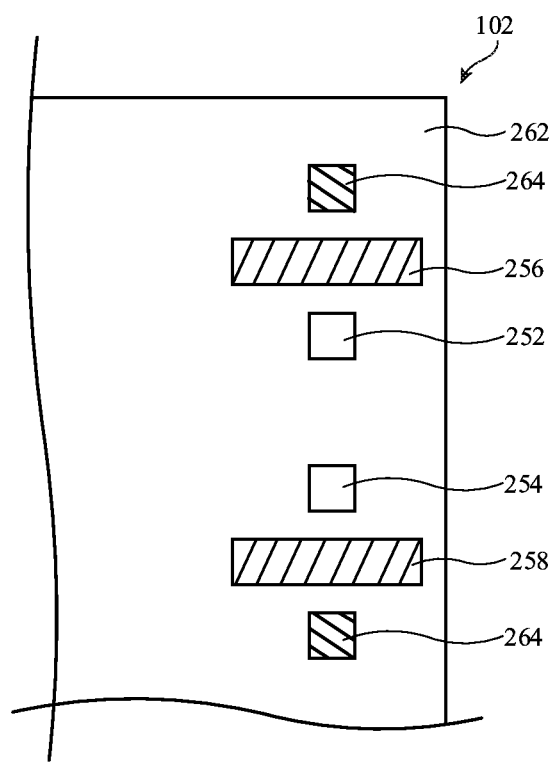

As previously mentioned, shielding structures 256 and 258 may have shapes other than ring-shapes. FIG. 9B is a top view of case 102 in FIG. 8B, showing an illustrative arrangement for components that are embedded in the case. As shown, shielding piece 256 may be interposed between core 252 and a magnetic alignment structure 264. Shielding piece 258 may be interposed between core 254 and a magnetic alignment structure 264. This example is merely illustrative. In another possible configuration, a single ring-shaped (e.g., rectangular ring-shaped) shielding structure may be formed around magnetic cores 252 and 254. However, in this embodiment, there is still no shielding material formed between magnetic cores 252 and 254 (as shielding in this area may not be advantageous to the magnetic performance of the system).

It should be noted that the specific examples of the embedded components in case 102 shown in FIGS. 8A, 8B, 9A, and 9B are merely illustrative. In general, the size, shape, and positioning of the magnetic cores in case 102 depends on the design of the transmitting and receiving devices with which the magnetic cores are intended to operate. The magnetic cores may be embedded at various locations within case 102. For example, the magnetic cores may be embedded in a front cover portion 102F of a removable cover having a folio shape (as shown in FIGS. 4 and 5). The magnetic cores may be embedded in the front cover portion 102F to overlap region 166, 168, 170, or 172 of a tablet computer. In this type of design, the embedded magnetic cores increase charging efficiency of a tablet computer transferring charge to a stylus placed on the front of the tablet computer.

However, the magnetic cores may instead be embedded in a sidewall of case 102 (e.g. in region 176 in FIG. 6) to enhance charging efficiency in an embodiment where the stylus is placed on the sidewall of the tablet computer for wireless charging. In general, the magnetic cores may be formed in any portion of a removable case that is interposed between devices transferring wireless power (e.g., a front portion of a removable case, a sidewall of a removable case, or a rear wall of a removable case).

Figure 10:
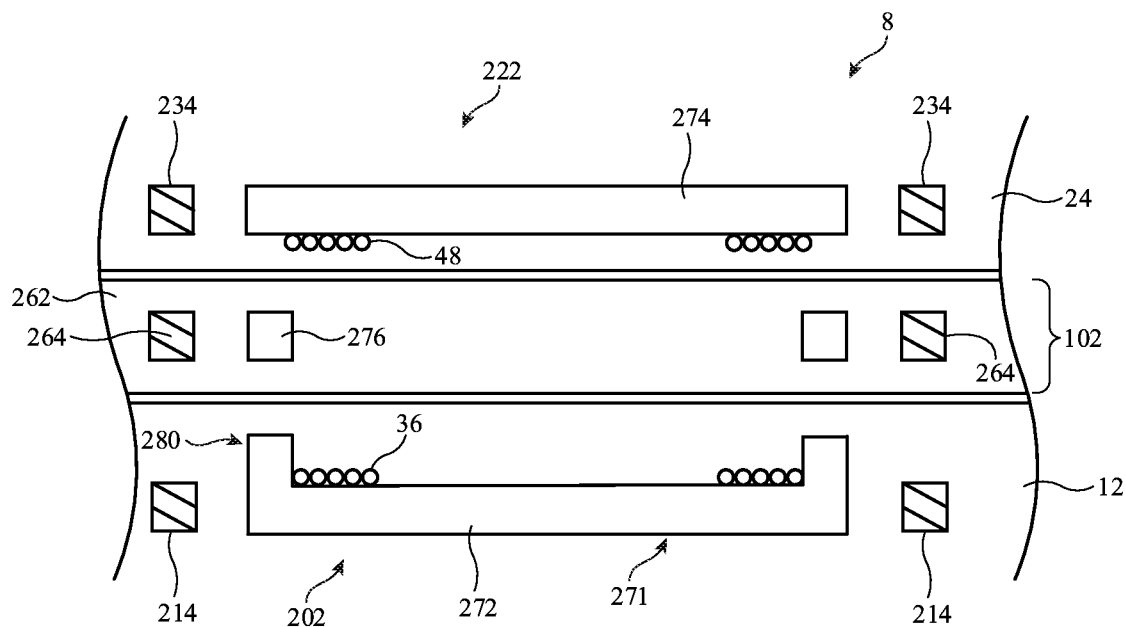
FIG. 10 is a side view of an illustrative wireless charging system with a removable case having a ring-shaped magnetic core that is interposed between a wireless power transmitting device and a wireless power receiving device in accordance with an embodiment.
Figure 11:
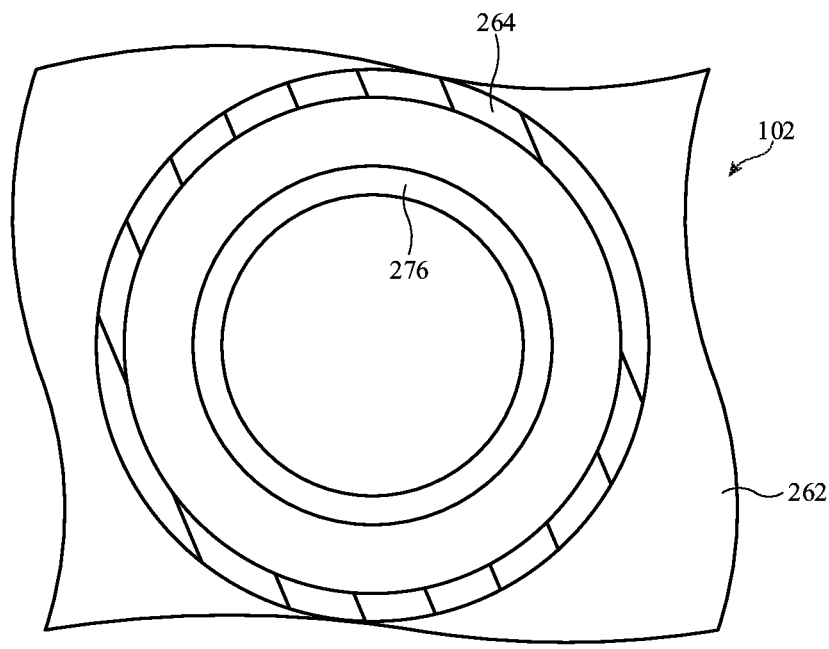
FIG. 11 is a top view of an illustrative removable cover with a ring-shaped magnetic core of the type shown in FIG. 10 in accordance with an embodiment.

An alternate example for the design of an embedded magnetic core in case 102 is shown in FIGS. 10 and 11. In FIG. 10, power transmitting device 12 includes a single coil 36 and a magnetic core 271. Magnetic core 271 may have a base 272 and limbs such as limb 280 (e.g., a ring-shaped limb) that protrudes away from a base portion of the core towards the outer surface of device 12. Power receiving device 24 also includes a single coil 48 with an associated magnetic core 274. A circular, ring-shaped magnetic core 276 is embedded in dielectric material 262 of cover 102 to relay flux from the transmitting device towards the receiving device. Magnetic core 276 may have a ring shape that aligns with the limb 280 of magnetic core 271 in the transmitting device. Similar to as in FIG. 8, magnetic core 276 in FIG. 10 is positioned in an area in the system with a high magnetic flux density (e.g., in a high magnetic flux density region between devices 12 and 24). This way, the magnetic core 276 serves as a relay and guides the magnetic field between transmitter 12 and receiver 24. Cover 102 again includes permanent magnets 264 to align the magnetic core 276 in the desired position and align coil 36 with coil 48. In some examples, core 276 is a continuous ring. In some examples, core 276 comprises multiple discrete core portions arranged in an arcuate manner such as to form a circular ring.

As an example, the arrangement of FIG. 10 may be used in a system where transmitting device 12 is a wireless charging mat or wireless charging puck. Wireless power receiving device 24 may be a portable electronic device such as a cellular telephone, tablet computer, etc. A portion of case 102 may be interposed between devices 12 and 24 during charging (e.g., rear portion 102R in FIG. 6).

FIG. 11 is a top view of a case including a ring-shaped magnetic core as in FIG. 10. As shown, magnetic core 276 is shaped in a ring (e.g., that aligns with limb 280 of core 271 in the transmitting device). Permanent magnet 264 may also have a ring shape that is concentric with the ring of magnetic core 276. If desired, one or more rings of shielding material (e.g., copper shielding material or another shielding material similar to as discussed in connection with FIG. 8) may be incorporated into the case. The ring(s) of shielding material may be concentric with the magnetic core 276 and magnetic alignment structure 264.

To summarize, a removable case may be coupled to an electronic device to protect and/or cover the electronic device. A portion of the removable case may be interposed between the electronic device and an additional electronic device during wireless power transfer operations. For example, the electronic device may transmit wireless power signals to the additional electronic device through a portion of the removable case. The electronic device may, instead or in addition, receive wireless power signals from the additional electronic device through a portion of the removable case. Wireless power signals may be transmitted and/or received through any desired portion of the removable case (e.g., a rear portion, a front portion, a sidewall portion, etc.). The wireless power signals may be transmitted and/or received through a portion of the removable case that overlaps a display area or border area of the screen of the electronic device. To improve efficiency of wireless power transfer when the removable case is interposed between the two devices, the removable case may include one or more magnetic cores that relay magnetic flux from a first surface of the case adjacent the transmitting device to a second surface of the case adjacent the receiving device. A removable cover of any desired type and shape may include one or more magnetic cores to relay magnetic flux during wireless power transfer operations of two adjacent devices.

The foregoing is merely illustrative and various modifications can be made to the described embodiments. The foregoing embodiments may be implemented individually or in any combination.

What is claimed is:

1. A cover for an electronic device having a front face, the cover comprising:
   a rear cover portion configured to receive the electronic device;
   a front cover portion configured to move relative to the rear cover portion and configured to cover the front face of the electronic device; and a ferrimagnetic core embedded in the front cover portion, wherein the ferrimagnetic core is configured to direct received magnetic flux from a first coil in the electronic device to a second coil in an additional electronic device;

a first magnetic alignment structure in the front cover portion; and a shielding structure in the front cover portion, wherein the shielding structure is interposed between the ferrimagnetic core and the first magnetic alignment structure.

2. The cover of claim 1, wherein the ferrimagnetic core is a first ferrimagnetic core and wherein first ferrimagnetic core is interposed between a second ferrimagnetic core in the electronic device and a third ferrimagnetic core in the additional electronic device when the first magnetic alignment structure is magnetically coupled to a second magnetic alignment structure in the electronic device and a third magnetic alignment structure in the additional electronic device.

3. The cover of claim 1, wherein the shielding structure is a circular shielding structure that laterally surrounds the ferrimagnetic core.

4. The cover of claim 1, wherein the shielding structure comprises copper.

5. The cover of claim 2, wherein the first magnetic alignment structure is a first permanent magnet, wherein the second magnetic alignment structure is a second permanent magnet, and wherein the third magnetic alignment structure is a third permanent magnet.

6. The cover of claim 1 wherein the ferrimagnetic core is positioned in a high magnetic flux density region between the electronic device and the additional electronic device when the first magnetic alignment structure is aligned with a second magnetic alignment structure in the electronic device and a third magnetic alignment structure in the additional electronic device.

7. The cover of claim 1, wherein the ferrimagnetic core is a first ferrimagnetic core and wherein the cover further comprises:

a second ferrimagnetic core embedded in the front cover portion, wherein the second ferrimagnetic core is configured to direct received magnetic flux from a third coil in the electronic device towards a fourth coil in the additional electronic device.

8. A cover for an electronic device having a front face, the cover comprising:

a rear cover portion configured to receive the electronic device;

a front cover portion configured to move relative to the rear cover portion and configured to cover the front face of the electronic device;

a first ferrimagnetic core embedded in the front cover portion, wherein the first ferrimagnetic core is configured to direct received magnetic flux from a first coil in the electronic device to a second coil in an additional electronic device;

a second ferrimagnetic core embedded in the front cover portion, wherein the second ferrimagnetic core is configured to direct received magnetic flux from a third coil in the electronic device towards a fourth coil in the additional electronic device;

a first permanent magnet in the front cover portion;

a second permanent magnet in the front cover portion;

a first shielding structure interposed between the first ferrimagnetic core and the first permanent magnet; and a second shielding structure interposed between the second ferrimagnetic core and the second permanent magnet.

9. The cover of claim 8, wherein the first permanent magnet is configured to magnetically couple to a third permanent magnet in the electronic device and wherein the first permanent magnet is configured to magnetically couple to a fourth permanent magnet in the additional electronic device.

10. The cover of claim 1, wherein the additional electronic device comprises a stylus and wherein the front cover portion is interposed between the stylus and the front face of the electronic device during wireless charging when the front cover portion covers the front face.

11. The cover of claim 10, wherein the stylus is configured to overlap a display area of a screen of the electronic device during wireless charging.

12. The cover of claim 10, wherein the stylus is configured to overlap a border area of the electronic device during wireless charging and wherein the border area is interposed between a display area of a screen of the electronic device and an edge of the electronic device.

13. The cover of claim 10, wherein the stylus and the electronic device are configured to transfer wireless power to one another when the stylus is placed directly on the front face of the electronic device.

14. An accessory for an electronic device, the accessory comprising:

a dielectric layer that is interposed between the electronic device and an additional electronic device during wireless power transfer operations between the electronic device and the additional electronic device;

a first magnetic alignment structure;

a first ferrimagnetic core in the dielectric layer that is interposed between a second ferrimagnetic core in the electronic device and a third ferrimagnetic core in the additional electronic device when the first magnetic alignment structure is magnetically coupled to a second magnetic alignment structure in the electronic device and a third magnetic alignment structure in the additional electronic device; and a shielding structure in the dielectric layer, wherein the shielding structure is interposed between the first ferrimagnetic core and the first magnetic alignment structure.

15. The accessory of claim 14, wherein the accessory further comprises a rear wall and peripheral sidewalls that define a recess configured to receive the electronic device.

16. The accessory of claim 15, wherein one of the peripheral sidewalls includes the dielectric layer and the first ferrimagnetic core.

17. The accessory of claim 15, wherein the rear wall includes the dielectric layer and the first ferrimagnetic core.

18. The accessory of claim 15, wherein the first ferrimagnetic core is configured to relay received magnetic flux from a first coil in the electronic device towards a second coil in the additional electronic device.

19. The accessory of claim 15, wherein the first ferrimagnetic core is configured to relay received magnetic flux from a first coil in the additional electronic device towards a second coil in the electronic device.

20. The accessory of claim 14, wherein the first magnetic alignment structure is a circular permanent magnet having a central opening and wherein the first ferrimagnetic core is a circular magnetic core positioned in the central opening.

* * * * *